(12) United States Patent
Grivna

(10) Patent No.: US 7,943,465 B2
(45) Date of Patent: May 17, 2011

(54) METHOD FOR MANUFACTURING A SEMICONDUCTOR COMPONENT

(75) Inventor: Gordon M. Grivna, Mesa, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 82 days.

(21) Appl. No.: 12/359,445

(22) Filed: Jan. 26, 2009

(65) Prior Publication Data

US 2010/0187696 A1 Jul. 29, 2010

(51) Int. Cl.
*H01L 21/768* (2006.01)

(52) U.S. Cl. ................ 438/270; 257/E21.585

(58) Field of Classification Search .............. 438/68, 438/270; 257/E21.585, E29.257, E27.091
See application file for complete search history.

(56) References Cited

U.S. PATENT DOCUMENTS

| | | | |
|---|---|---|---|
| 2004/0256666 A1* | 12/2004 | Fujishima et al. | 257/329 |
| 2006/0199359 A1* | 9/2006 | Jeon et al. | 438/585 |
| 2006/0286796 A1* | 12/2006 | Nagel et al. | 438/640 |
| 2008/0242044 A1* | 10/2008 | Hong | 438/435 |
| 2010/0019301 A1* | 1/2010 | Huang | 257/303 |

* cited by examiner

*Primary Examiner* — Thao P. Le
(74) *Attorney, Agent, or Firm* — Rennie William Dover

(57) ABSTRACT

A semiconductor component that includes a contact landing pad and a method for manufacturing the semiconductor component. A trench having sidewalls is formed in a semiconductor material and a dielectric material is formed on the sidewalls of the trench. An electrically conductive material is formed on the sidewalls and fills the trench. A multi-layer dielectric structure is formed over the electrically conductive material in the trench, where the multi-layer dielectric material is comprised of a dielectric material of one type sandwiched between dielectric materials of a different type such that an etch rate of the middle layer of dielectric material is different from those of the outer layers of dielectric material. Portions of the middle layer of dielectric material are removed and replaced with electrically conductive material that, in combination with portions of the electrically conductive material in the trench, form a contact landing pad.

14 Claims, 10 Drawing Sheets

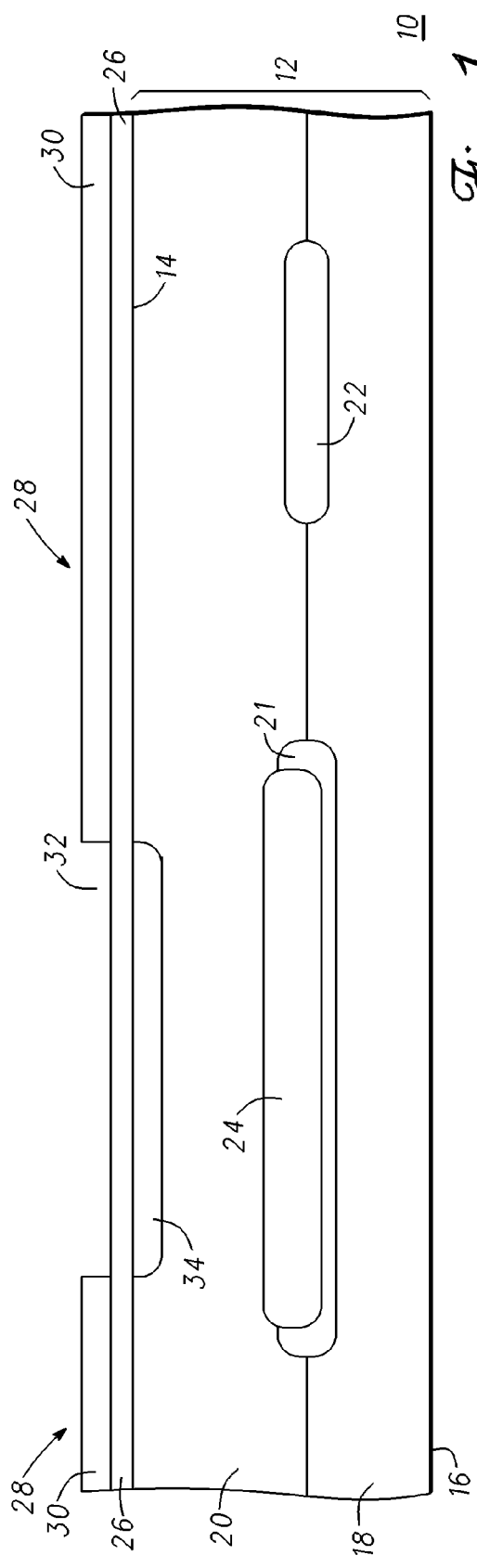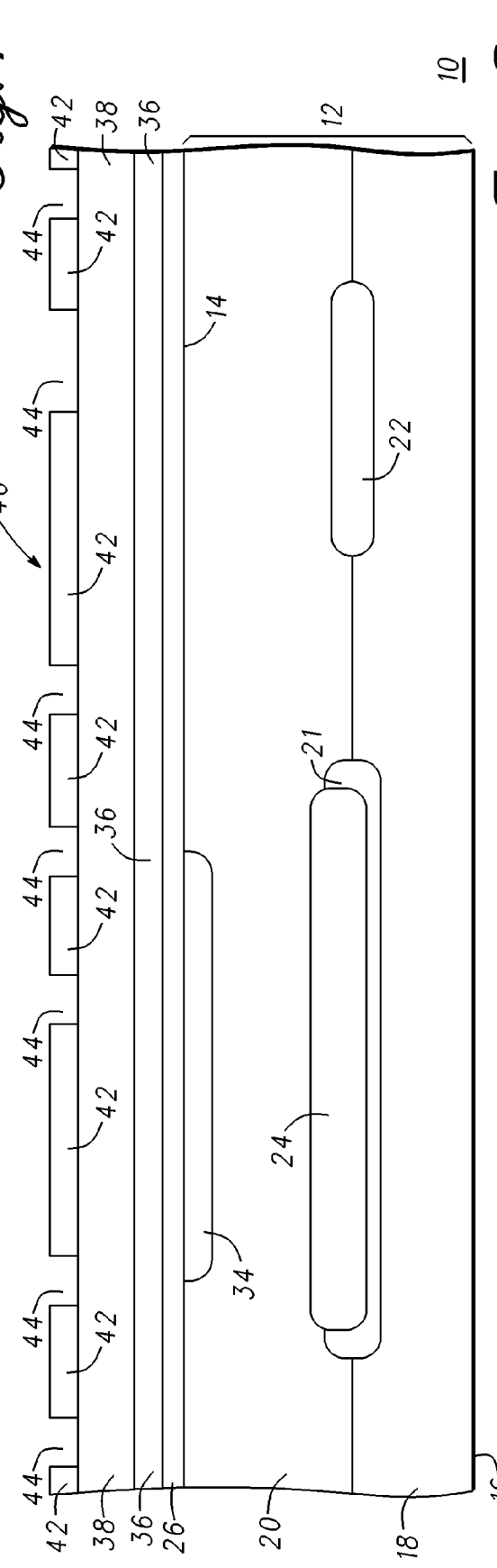

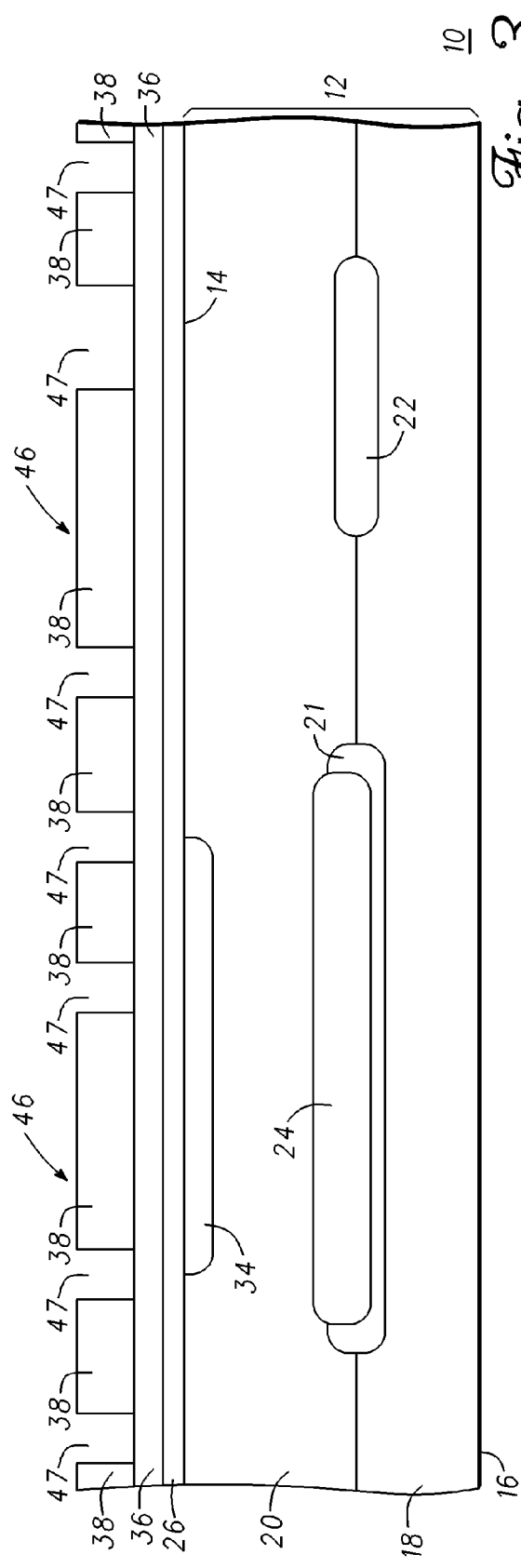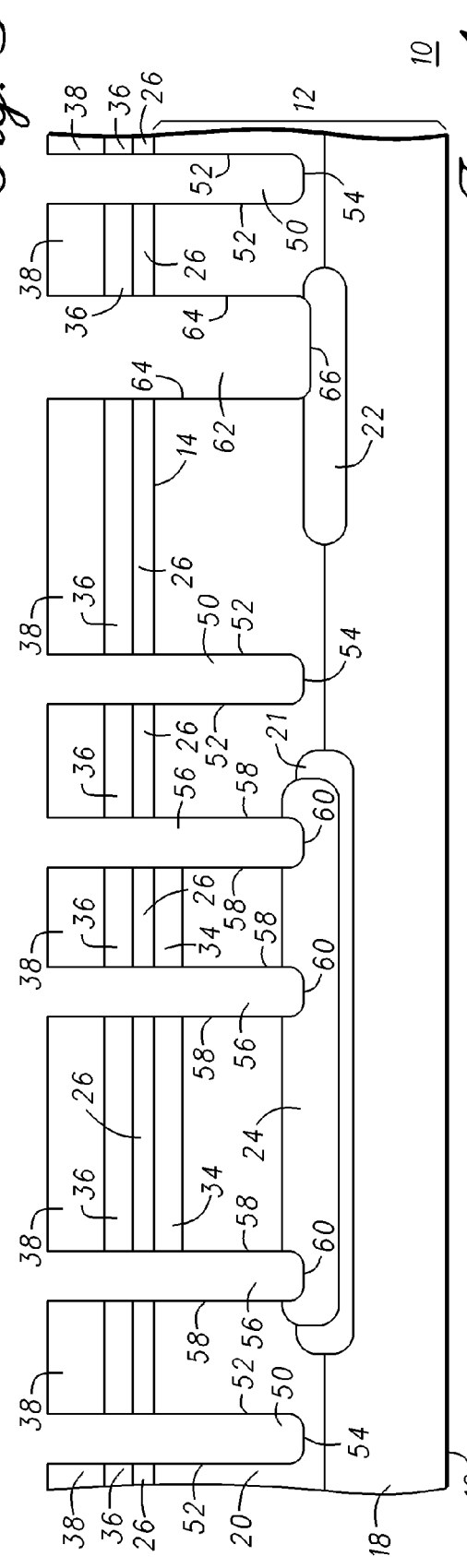

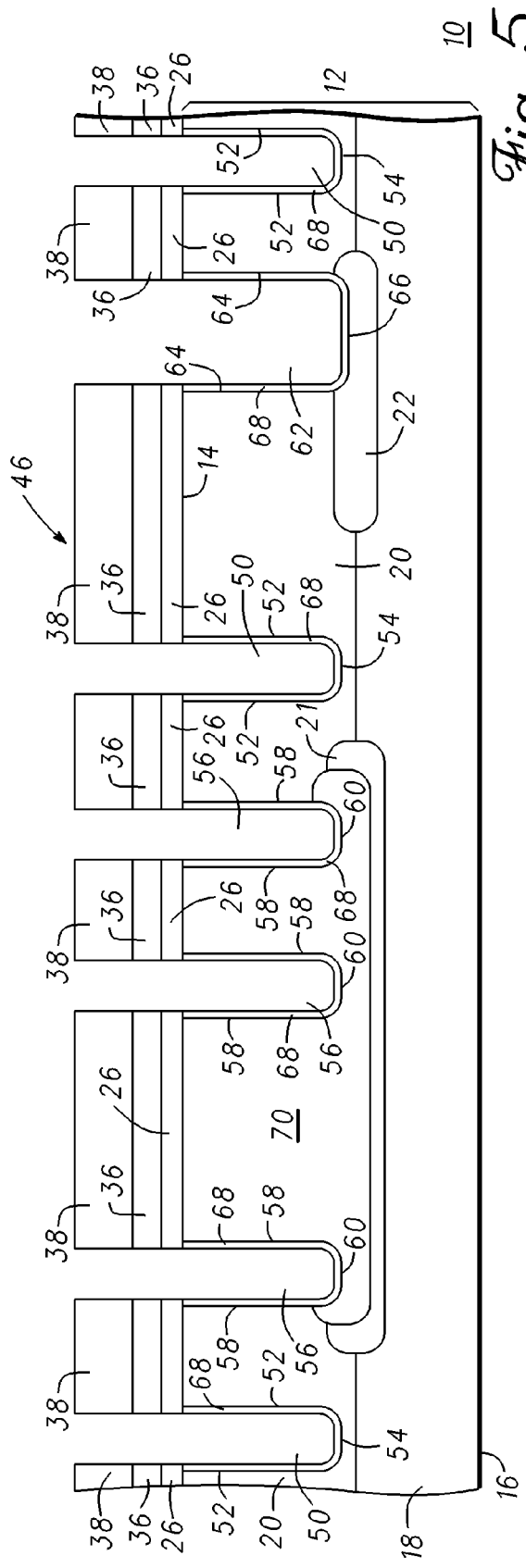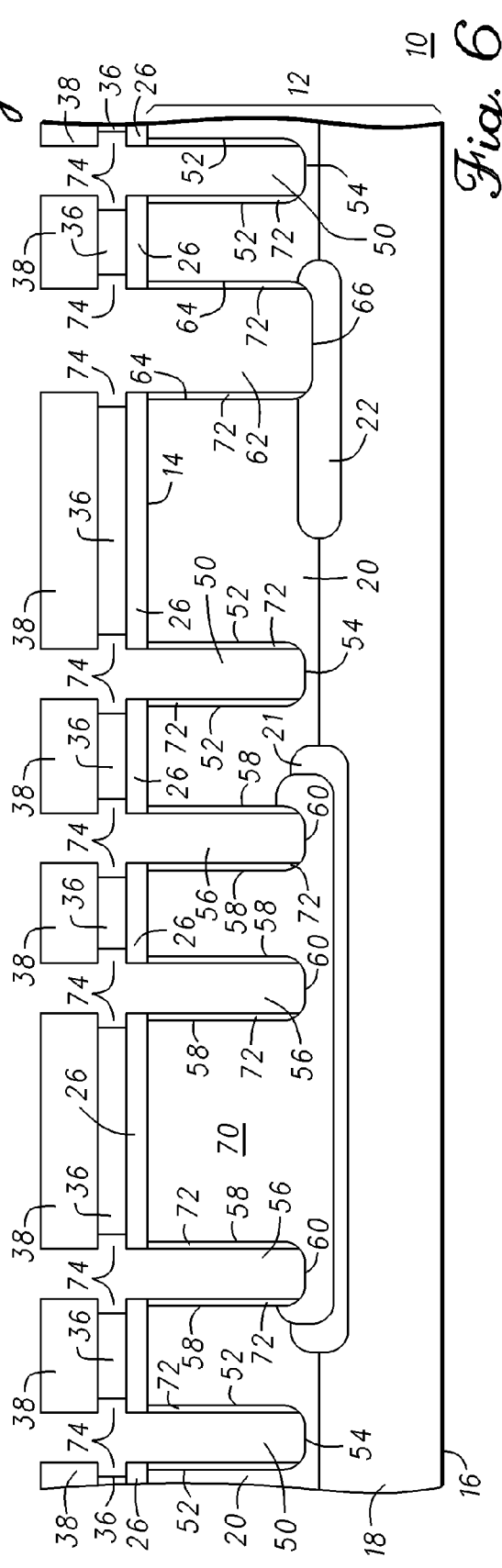

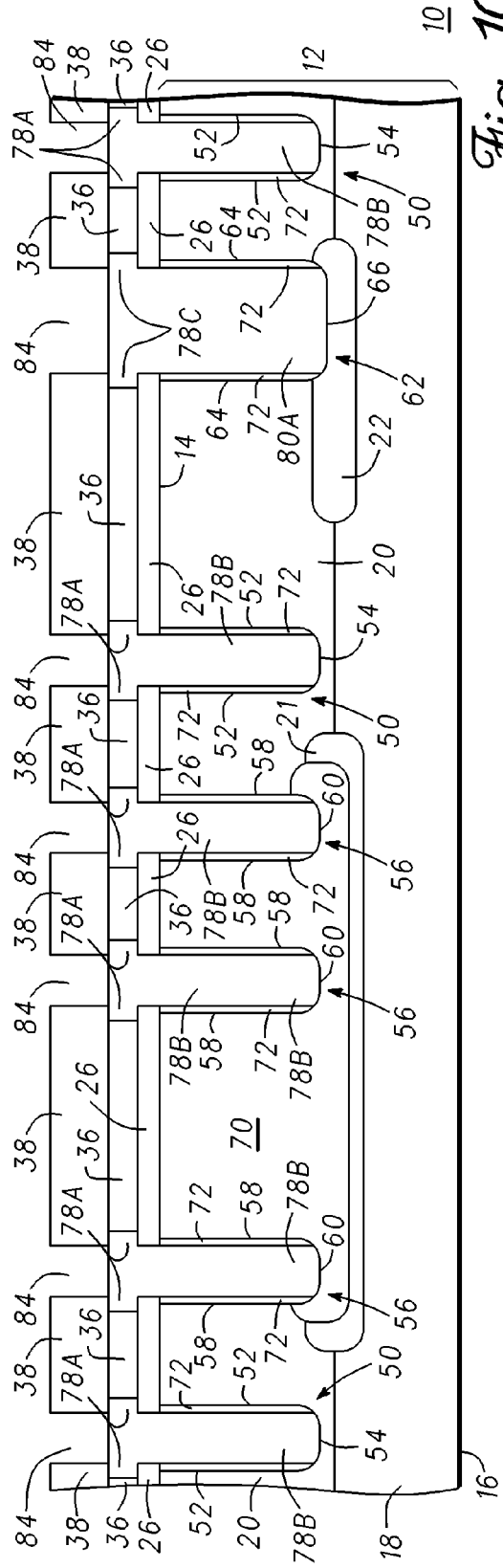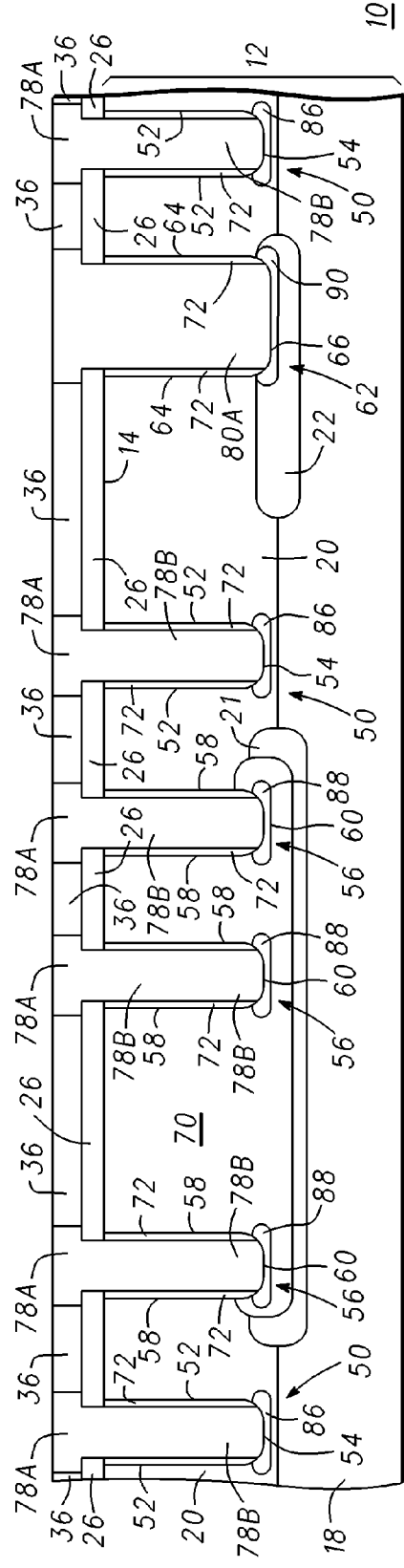

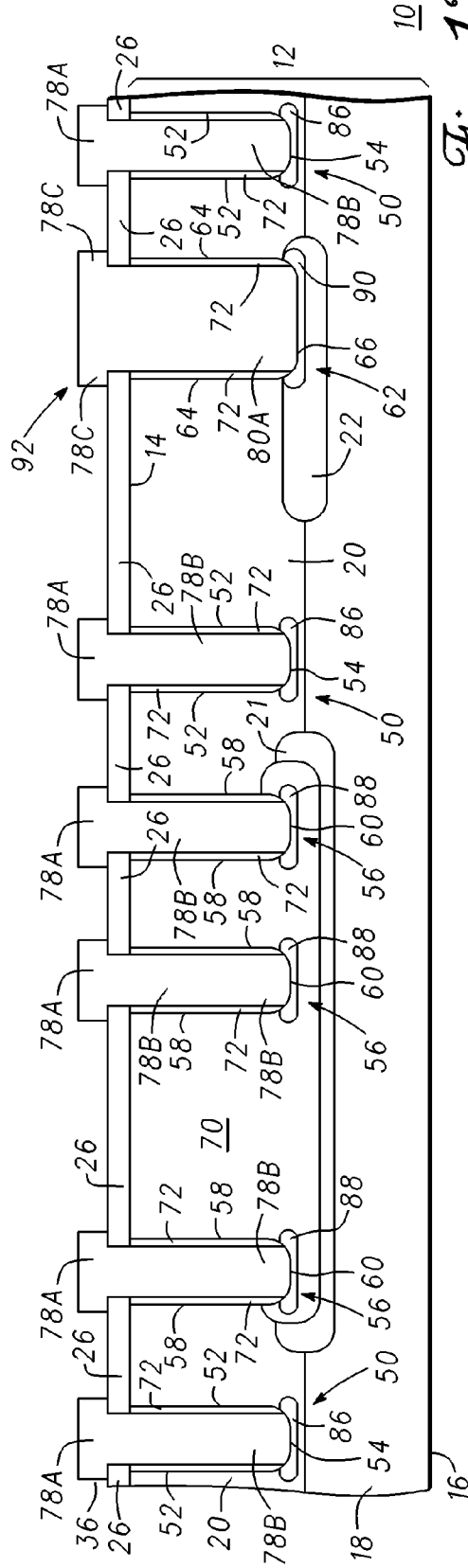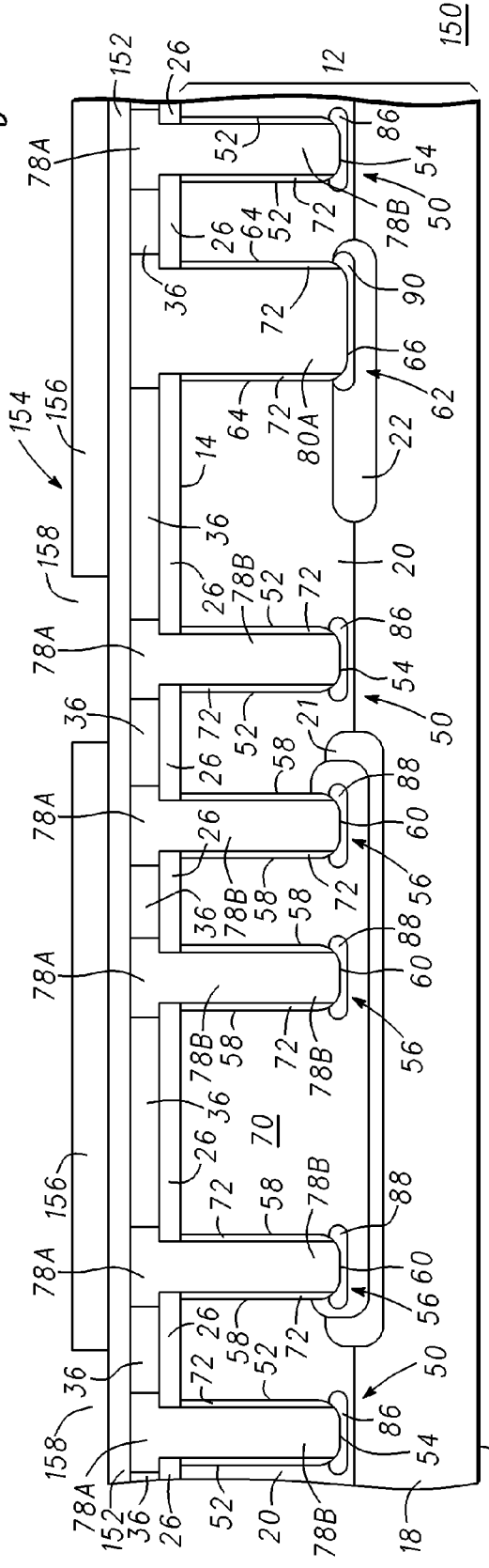

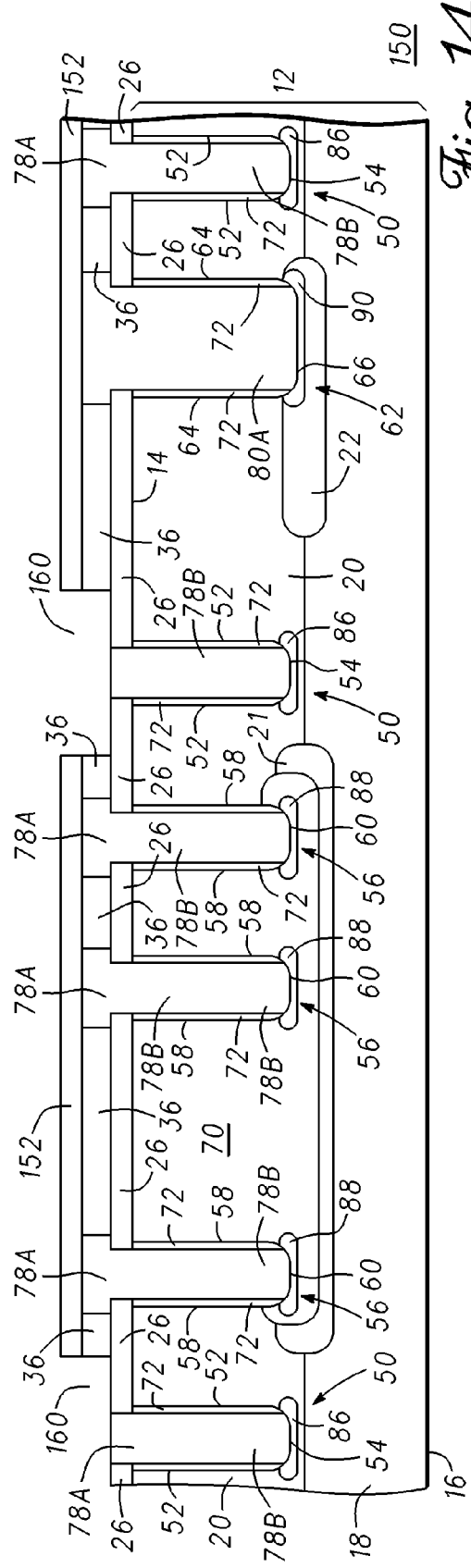
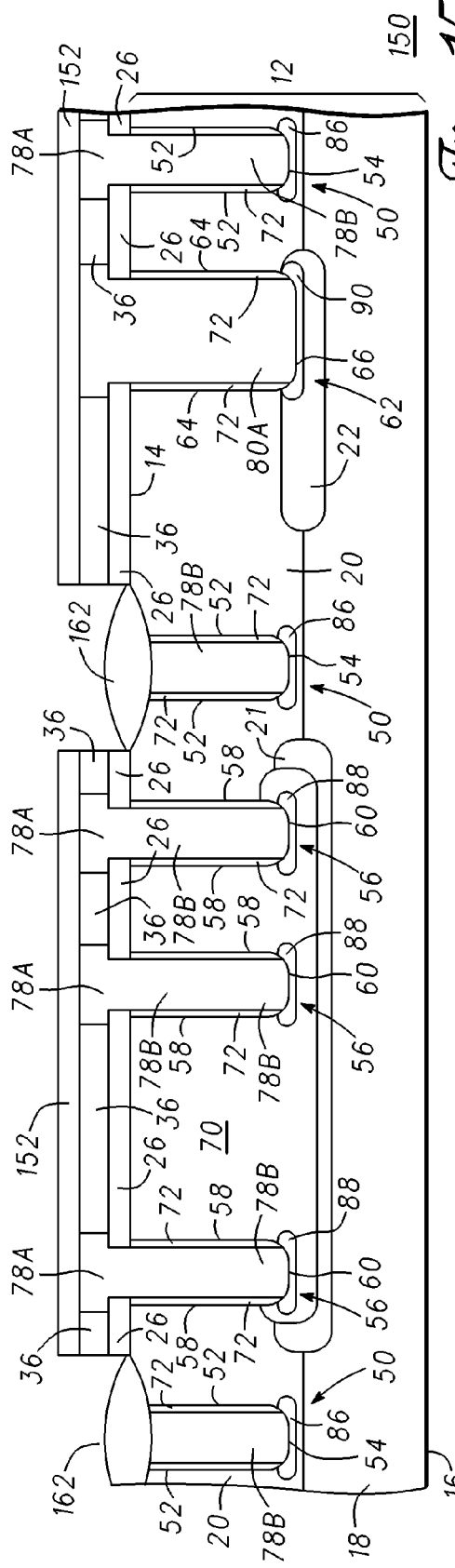

US 7,943,465 B2

METHOD FOR MANUFACTURING A SEMICONDUCTOR COMPONENT

TECHNICAL FIELD

The present invention relates, in general, to semiconductor components and, more particularly, to semiconductor components having trenches.

BACKGROUND

Metal-Oxide Semiconductor Field Effect Transistors ("MOSFETs") are a common type of power switching device. A MOSFET device includes a source region, a drain region, a channel region extending between the source and drain regions, and a gate structure provided adjacent to the channel region. The gate structure includes a conductive gate electrode layer disposed adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state. As those skilled in the art are aware, MOSFETs can be P-channel field effect transistors, N-channel field effect transistors, depletion mode devices, etc.

To reduce costs by making smaller geometry semiconductor devices and to improve performance, semiconductor component manufacturers have developed techniques in which the gate structures of field effect transistors, isolation regions, and deep contacts into the silicon are manufactured in trenches. The trenches are made at the minimum capable geometry of the photolithography equipment to minimize space and to minimize the amount of material needed to fill and etchback the trench openings. Because the trenches are at their minimum feature size, making contact to them is difficult. Typically, contacts are made using a masking step that leaves trench-fill material behind as a contact opening trench stop pad. Drawbacks with this approach include increased cost of the semiconductor components, increased sizes of the chips or dice from which semiconductor components are made, and, for wider trench geometries, increased topography of the semiconductor chips because of the increased amount of material left behind.

Accordingly, it would be advantageous to have a semiconductor component having a contact landing pad and a method for manufacturing the contact landing pad that is suitable for small geometry semiconductor devices. It would be of further advantage for the semiconductor component to be cost efficient to manufacture.

BRIEF DESCRIPTION OF THE DRAWINGS

The present invention will be better understood from a reading of the following detailed description, taken in conjunction with the accompanying drawing figures, in which like reference characters designate like elements and in which:

FIG. 1 is a cross-sectional view of a semiconductor component at an early stage of manufacture in accordance with an embodiment of the present invention;

FIG. 2 is a cross-sectional view of the semiconductor component of FIG. 1 at a later stage of manufacture;

FIG. 3 is a cross-sectional view of the semiconductor component of FIG. 2 at a later stage of manufacture;

FIG. 4 is a cross-sectional view of the semiconductor component of FIG. 3 at a later stage of manufacture;

FIG. 5 is a cross-sectional view of the semiconductor component of FIG. 4 at a later stage of manufacture;

FIG. 6 is a cross-sectional view of the semiconductor component of FIG. 5 at a later stage of manufacture;

FIG. 10 is a cross-sectional view of the semiconductor component of FIG. 9 at a later stage of manufacture;

FIG. 11 is a cross-sectional view of the semiconductor component of FIG. 10 at a later stage of manufacture;

FIG. 12 is a cross-sectional view of the semiconductor component of FIG. 11 at a later stage of manufacture;

FIG. 13 is a cross-sectional view of a semiconductor component in accordance with another embodiment of the present invention during manufacture;

FIG. 14 is a cross-sectional view of the semiconductor component of FIG. 13 at a later stage of manufacture;

FIG. 15 is a cross-sectional view of the semiconductor component of FIG. 14 at a later stage of manufacture.

DETAILED DESCRIPTION

Figure 7:
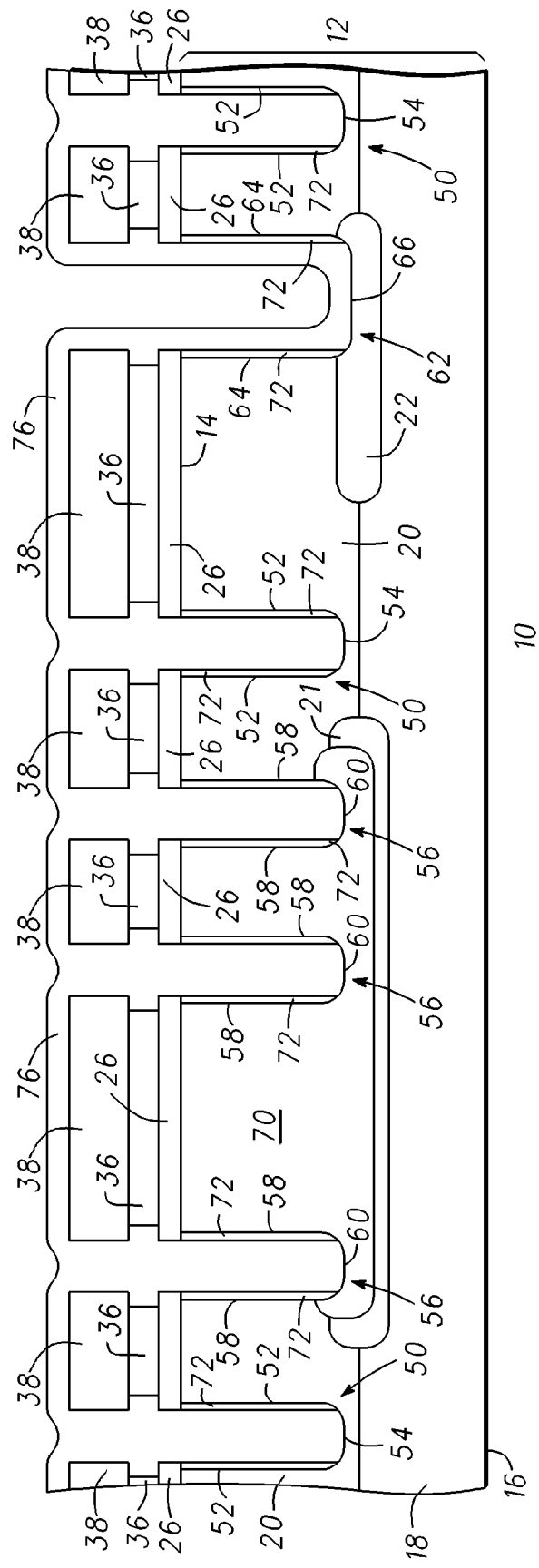
FIG. 7 is a cross-sectional view of the semiconductor component of FIG. 6 at a later stage of manufacture.

Generally, the present invention provides a semiconductor component that includes a landing pad for making electrical interconnects. In accordance with an embodiment, a semiconductor component is manufactured by providing a semiconductor material that is preferably comprised of an epitaxial layer having a body region formed on a substrate. One or more trenches are formed in the semiconductor material. At least one landing pad is formed over the portions of the semiconductor material adjacent to the one or more trenches and over the one or more trenches. In accordance with one embodiment, polysilicon fills a trench where a portion of the polysilicon serves as the landing pad and a portion of the polysilicon is within the trench. Thus, the material of the landing pad and the trench fill material may form a unitary structure.

In accordance with another embodiment, the semiconductor component comprises a semiconductor material having a major surface and a layer of dielectric material on the major surface. A trench extends into the semiconductor material and an electrically conductive material is in the trench. A landing pad is over a portion of the layer of dielectric material and the electrically conductive material in the trench.

FIG. 1 is a cross-sectional view of a portion of a semiconductor component 10 during manufacture in accordance with an embodiment of the present invention. What is shown in FIG. 1 is a semiconductor material 12 having opposing surfaces 14 and 16. Surface 14 is also referred to as a front or top surface and surface 16 is also referred to as a bottom or back surface. In accordance with an embodiment, semiconductor material 12 comprises an epitaxial layer 20 that is disposed on a semiconductor substrate 18. Preferably, substrate 18 is silicon that is heavily doped with an N-type dopant or impurity material and epitaxial layer 20 is silicon that is lightly doped with an N-type dopant. The resistivity of substrate layer 18 may be less than about 0.01 Ohm-centimeters ($\Omega$-cm) and the resistivity of epitaxial layer 20 may be greater than about 0.1 $\Omega$-cm. Substrate layer 18 provides a low resistance conduction path for the current that flows through a power transistor and a low resistance electrical connection to a bottom drain conductor that is formed on bottom surface 16 of semiconductor material 12, a top drain conductor, or both.

Dopant regions 21 and 22 of P-type conductivity may be formed from portions of substrate 18 and epitaxial layer 20 and a dopant region of N-type conductivity 24 may be formed in dopant region 21 and epitaxial layer 20. Dopant region 21 provides isolation between transistors manufactured in semiconductor material 12 and dopant region 22 serves as a portion of a substrate contact as discussed below. A region or layer doped with an N-type dopant is referred to as a region or a dopant region having an N-type conductivity or an N conductivity type and a region or layer doped with a P-type dopant is referred to as a region or a dopant region having a P-type conductivity or a P conductivity type. N-type dopants are also referred to as N-type impurity materials and P-type dopants are also referred to as P-type impurity materials. Examples of N-type impurity materials include phosphorus and arsenic and examples of P-type impurity materials include boron and indium.

A layer of dielectric material 26 is formed on or from epitaxial layer 20. In accordance with an embodiment, the material of dielectric layer 26 is oxide having a thickness ranging from about 200 Angstroms (Å) to about 1,000 Å. Techniques for forming oxide layer 26 are known to those skilled in the art. Oxide layer 26 is also referred to as a pad oxide or pad oxide layer. A layer of photoresist is patterned over oxide layer 26 to form a masking structure 28 having masking elements 30 and an opening 32 that exposes a portion of oxide layer 32. Masking structure 34 is also referred to as an implant or implant protect mask. A P-type conductivity dopant layer 34 is formed in epitaxial layer 20. Dopant layer 34 may be formed by implanting an impurity material such as, for example, boron into epitaxial layer 20. The boron may be implanted at a dose ranging from about $1\times10^{13}$ ions per centimeter squared (ions/cm$^2$) to about $1\times10^{14}$ ions/cm$^2$ and an implant energy ranging from about 100 kilo electron volts (keV) to about 400 keV. The technique for forming dopant layer 34 is not limited to an implantation technique. Masking structure 28 is removed.

Referring now to FIG. 2, a layer of dielectric material 36 having a thickness ranging from about 1,000 Å to about 3,000 Å is formed over oxide layer 26 and a layer of dielectric material 38 having a thickness ranging from about 10,000 Å to about 15,000 Å is formed over dielectric layer 36. By way of example, dielectric layer 36 is silicon nitride and dielectric layer 38 is oxide formed by the decomposition of tetraethylorthosilicate (TEOS). Oxide layers formed by the decomposition of TEOS are referred to as TEOS layers and silicon nitride layers may be referred to as nitride layers. It should be noted that the materials of dielectric layers 26, 36, and 38 are selected so that dielectric layer 36 has a different etch rate than dielectric layers 26 and 38. A layer of photoresist is patterned over TEOS layer 38 to form a masking structure 40 having masking elements 42 and openings 44 that expose portions of TEOS layer 38. Masking structure 40 is also referred to as an etch mask.

Referring now to FIG. 3, the portions of TEOS layer 38 exposed by openings 44 are anisotropically etched using for example, a reactive ion etch, to expose portions of dielectric layer 36. Masking structure 40 is removed. The remaining portions of TEOS layer 38 serve as a hardmask 46 having openings 47. Because TEOS layer 38 has been separated into a plurality of portions, it may be referred to as TEOS layers 38, i.e., a plurality of layers.

Referring now to FIG. 4, trenches 50 having sidewalls 52 and floors 54, trenches 56 having sidewalls 58 and floors 60, and a trench 62 having sidewalls 64 and a floor 66 are formed in epitaxial layer 20 by removing the portions of silicon nitride layer 36 exposed by hardmask 46, i.e., removing the portions of silicon nitride layer 36 exposed by openings 44 in hardmask 46, and the portions of oxide layer 26, dopant region 34, and epitaxial layer 20 underlying the portions of silicon nitride layer 36 exposed by openings 44. The portions of layers 36, 26, 20 and doped region 34 may be removed using an anisotropic etch technique such as, for example, reactive ion etching. Although trenches 50, 56, and 62 are shown as ending in epitaxial layer 20, this is not a limitation of the present invention. For example, trenches 50 and 56 may extend into substrate 18. Preferably, trenches 56 extend to dopant region 24 and trench 62 extends to dopant region 22. The etching technique, the number of trenches, or the shape of the trenches formed in epitaxial layer 20 are not limitations of the present invention. Like TEOS layer 38, silicon nitride layer 36 and oxide layer 26 have been separated into a plurality of portions that may be referred to as silicon nitride layers 36 and oxide layers 26, i.e., a plurality of layers.

Referring now to FIG. 5, dielectric layers 68 having a thickness ranging from about 750 Å to about 2,500 Å are grown along sidewalls 52, 58, and 64 and on floors 54, 60, and 66 of trenches 50, 56, and 62, respectively. Preferably, dielectric layers 68 are thermally grown oxide layers. The thermal growth of oxide layers 68 drives the impurity materials of dopant regions 24 and 34 into epitaxial layer 20 forming a dopant region 70 of P-type conductivity which is referred to as a body region.

Referring now to FIG. 6, oxide layers 68 are anisotropically etched to form spacers 72 along sidewalls 52, 58, and 64 and to expose floors 54, 60, and 66 of trenches 50, 56, and 62, respectively. By way of example, oxide layers 68 are anisotropically etched using reactive ion etching. Semiconductor material 12 is cleaned using a wet dip in a dilute hydrofluoric acid solution. Silicon nitride layers 36 are treated to a nitride wet etch using hot phosphoric acid to form landing pad cavities 74 between dielectric layers 26 and 38. The nitride wet etchant laterally etches away portions of silicon nitride layer 36 that are between dielectric layers 26 and 38 to form landing pad cavities 74. The type of wet etchant is not a limitation of the present invention.

Referring now to FIG. 7, an electrically conductive material 76 is formed over TEOS layers 38 and in trenches 50, 56, and 62, and in landing pad cavities 74. Preferably, electrically conductive material 76 is a layer of polysilicon that is grown over dielectric layers 38, fills trenches 50, 56, and 62, landing pad cavities 74, and has a thickness ranging from about 5,000 Å to about 10,000 Å. The conductive layer 76 can include silicides such as tungsten silicide, stacked layers of polysilicon and silicide or any number of other conductive materials. By way of example, polysilicon layer 76 is doped with a P-type impurity material such as boron and has a thickness of about 8,000 Å. The electrically conductive material may also be referred to as a trench fill material. In accordance with an embodiment, the width of trench 62 is larger than the widths of trenches 50 and 56, thus polysilicon layer 76 partially fills trench 62.

Figure 8:
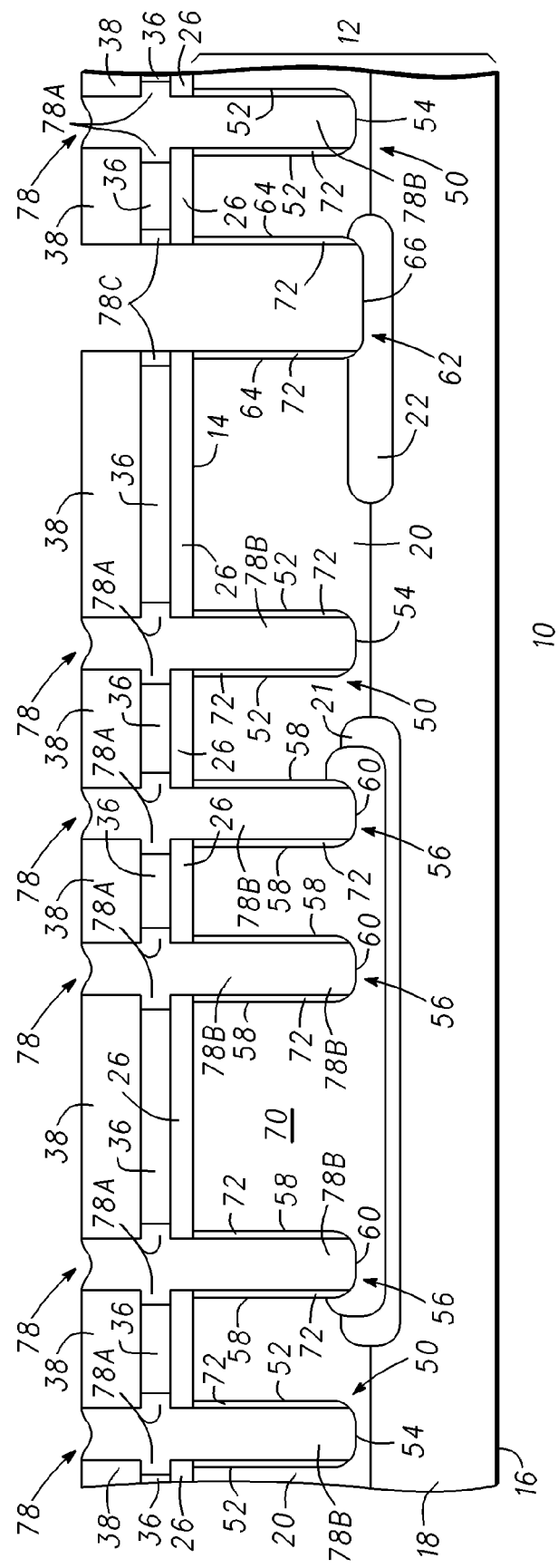
FIG. 8 is a cross-sectional view of the semiconductor component of FIG. 7 at a later stage of manufacture.

Referring now to FIG. 8, polysilicon layer 76 is removed from TEOS layer 38. In the preferred embodiment polysilicon layer 76 is isotropically stripped from TEOS layers 38 using, for example, an isotropic dry etch. Isotropically stripping polysilicon layer 76 leaves portions 78 in landing pad cavities 74 and in trenches 50, 56, and 62. For the sake of clarity, sub-portions 78A of portions 78 of polysilicon layer 76 are the portions that are in landing pad cavities 74 and the regions between and laterally adjacent to landing pad cavities 74 and sub-portions 78B of portions 78 of polysilicon layer 76 are in trenches 50, 56, and 62. Isotropically stripping polysilicon layer 76 removes the portions of polysilicon layer 76 from cavity 62, except sub-portions 78C that remain in landing pad cavities 74.

Figure 9:
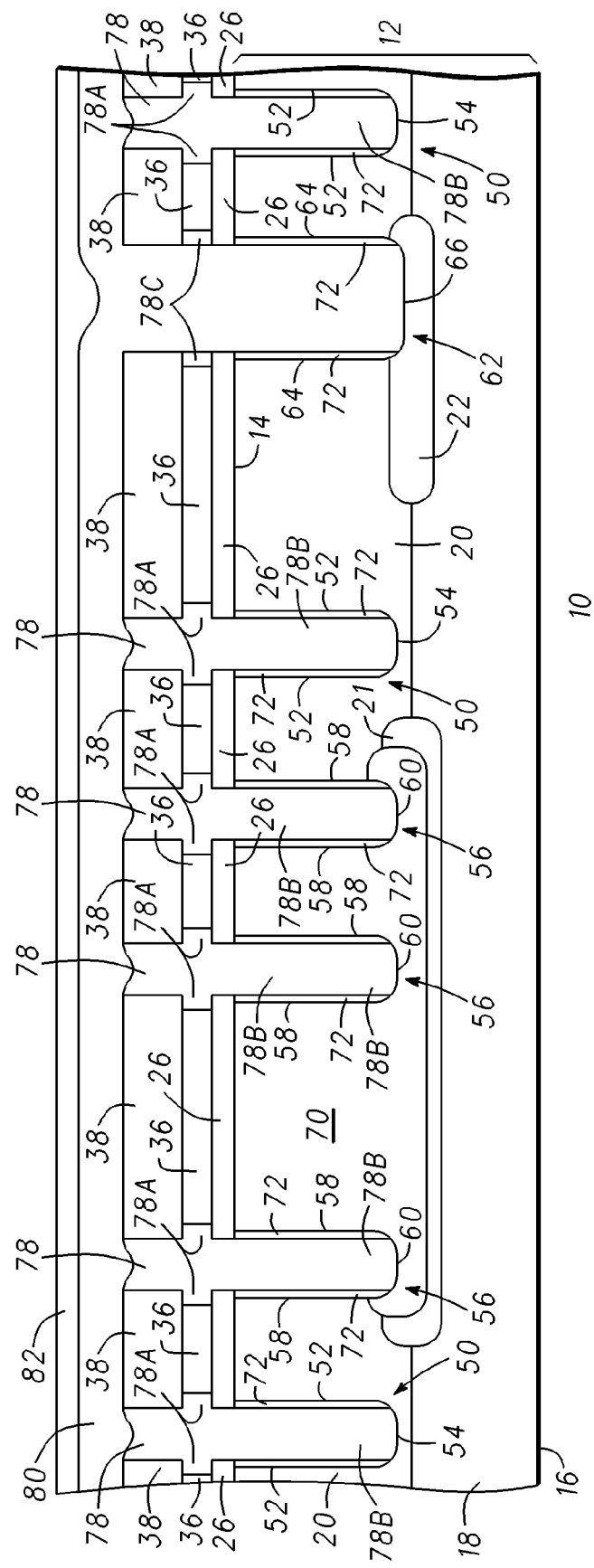
FIG. 9 is a cross-sectional view of the semiconductor component of FIG. 8 at a later stage of manufacture.

Referring now to FIG. 9, a layer of polysilicon 80 having a thickness ranging from about 12,000 Å to about 20,000 Å is grown over TEOS layers 38 and over portions 78 of polysilicon layer 76. By way of example, polysilicon layer 80 is doped with an N-type impurity material such as phosphorus and has a thickness of about 16,000 Å. A layer of photoresist 82 is formed on polysilicon layer 80.

Referring now to FIG. 10, photoresist layer 82 and polysilicon layer 80 are etched using a timed recess etch leaving portion 80A in trench 62 and forming openings 84 that expose sub-portions 78A of polysilicon layer 76. The recess etch can be an isotropic etch, an anisotropic etch, a dry etch, a wet etch, or combinations thereof.

Referring now to FIG. 11, TEOS layers 38 are stripped away using, for example, a wet etchant. Optionally, polysilicon portions 78A, 78B, 78C, and 80A are annealed. Annealing portion 78A drives the impurity material of polysilicon portions 78A in trenches 50 into epitaxial layer 20 forming enhanced dopant regions 86; drives the impurity material of polysilicon portions 78A in trenches 56 into body region 70 forming enhanced dopant or body regions 88; drives the impurity material of polysilicon portion 80A in trench 62 into dopant region 22 forming an enhanced dopant region 90; and drives the impurity material of polysilicon portion 80A into polysilicon portions 78C to compensate the impurity material of polysilicon portions 78C so they are of the same conductivity type as polysilicon portion 80A, i.e., P-type conductivity when polysilicon portion 80A is P-type conductivity.

Referring now to FIG. 12, dielectric layer 36 is removed or stripped away using a wet etchant leaving portions 78A that serve as landing pads. In addition, stripping away dielectric layer 36 leaves portions 78C which, in combination with the region of polysilicon portion 80 that is laterally adjacent to portions 76C, form a landing pad 92. It should be appreciated that landing pads 78A are self-aligned to trenches 50 and 56 and landing pad 92 is self-aligned to trench 62.

FIG. 13 is a cross-sectional view of a portion of a semiconductor component 150 during manufacture in accordance with another embodiment of the present invention. It should be noted that the process steps for manufacturing semiconductor component 150 are similar to those for manufacturing semiconductor component 10 as described with reference to FIGS. 1-11. Accordingly, the description of the manufacture of semiconductor component 150 continues from FIG. 11 with the understanding that in this embodiment, reference character 10 shown in FIGS. 1-11 pertain to reference character 150. A layer of dielectric material 152 having a thickness ranging from about 250 Å to about 1,000 Å is formed on dielectric layers 36, polysilicon portions 78A, and polysilicon portion 80A. Preferably, the material of dielectric layer 152 is the same as the material of dielectric layers 36. In accordance with an embodiment, the material of dielectric layer 152 is silicon nitride having a thickness of about 500 Å. A layer of photoresist is patterned on silicon nitride layer 152 to form a masking structure 154 having masking elements 156 and openings 158 that expose portions of dielectric layer 152. Masking structure 154 is also referred to as an etch protect mask.

Referring now to FIG. 14, the exposed portions of silicon nitride layer 152 and the portions of silicon nitride layers 26 are anisotropically etched exposing one or more of portions 78A. The etch stops on oxide layers 26. Then, the one or more portions 78A that have been exposed are etched using an anisotropic etch. The anisotropic etch forms openings 160 that expose polysilicon portions 78B in one or more of trenches 52. Like the silicon nitride etch, the etching of portions 78A stops on oxide layers 26. By way of example, silicon nitride layers 36 and 152 and portions 78A may be anisotropically etched using a reactive ion etch where the etch chemistries are tailored to etch silicon nitride then changed to etch polysilicon.

Referring now to FIG. 15, a field oxidation is performed to grow field oxide isolation regions 162 from the exposed polysilicon portions 78B and portions of epitaxial layer 20 below openings 160.

Figure 16:
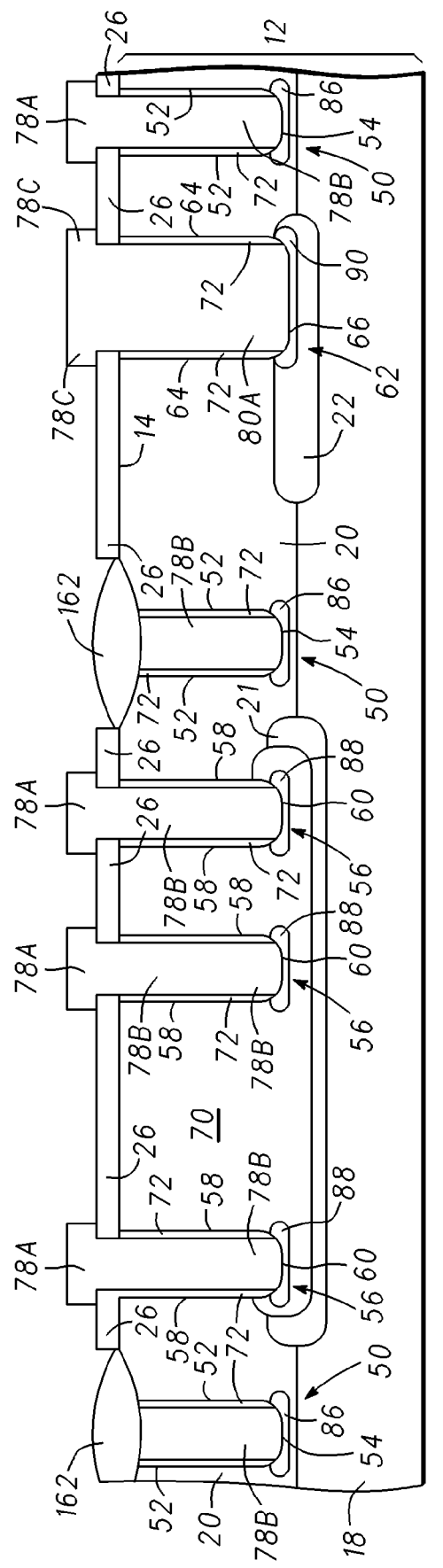
FIG. 16 is a cross-sectional view of the semiconductor component of FIG. 15 at a later stage of manufacture.

Referring now to FIG. 16, dielectric layers 36 and 152 are removed or stripped away using a wet etchant leaving portions 78A that serve as landing pads. In addition, stripping away dielectric layer 36 leaves portions 78C which, in combination with the region of polysilicon portion 80 that is laterally adjacent to portions 76C, form landing pad 92.

By now it should be appreciated that a semiconductor component having a landing pad and a method for manufacturing the semiconductor component have been provided. Manufacturing the landing pad does not use extra layers of polysilicon thereby lowering the cost of manufacturing the semiconductor component. In addition, in embodiments that include trenches the trench dimensions are independent of the thickness of the contact landing pad. Another advantage of embodiments of the present invention is that the landing pad is self-aligned to the trenches.

Although certain preferred embodiments and methods have been disclosed herein, it will be apparent from the foregoing disclosure to those skilled in the art that variations and modifications of such embodiments and methods may be made without departing from the spirit and scope of the invention. For example, one or more of dopant regions 21, 22, and 24 may be omitted. Alternatively, semiconductor devices with top side contacts or bottom side contacts can be manufactured. It is intended that the invention shall be limited only to the extent required by the appended claims and the rules and principles of applicable law.

What is claimed is:

1. A method for manufacturing a semiconductor component, comprising:
   providing a semiconductor material having a major surface;
   forming at least one trench in the semiconductor material, the at least one trench having a floor and sidewalls;
   forming at least one self-aligned landing pad over and laterally adjacent to the at least one trench, wherein forming the at least one self-aligned landing pad includes:
   forming a first layer of dielectric material over the major surface;
   forming a second layer of dielectric material over the first layer of dielectric material;
   forming a third layer of dielectric material over the second layer of dielectric material;
   forming an opening through the first, second, and third layers of dielectric material; and
   removing a portion of the second layer of dielectric material that is exposed by the opening extending through the first, second, and third layers of dielectric material to form cavities that extend laterally into the second layer of dielectric material.

2. The method of claim 1, wherein the first, second, and third layers of dielectric material are oxide, nitride, and oxide, respectively.

3. The method of claim 1, wherein removing the portion of the second layer of dielectric material includes removing the portion of the second layer of dielectric material with a wet etchant.

4. The method of claim 3, further including forming an electrically conductive material in the at least one trench and the cavities that extend laterally into the second layer of dielectric material.

5. The method of claim 4, further including removing the second and third layers of dielectric material.

6. The method of claim 1, wherein forming the at least one self-aligned landing pad over and laterally adjacent to the at least one trench includes forming the at least one self-aligned landing pad over a portion of the at least one trench.

7. The method of claim 1, further including forming sidewall spacers along the sidewalls of the at least one trench.

8. The method of claim 7, further including forming an electrically conductive material in the at least one trench.

9. A method for manufacturing a semiconductor component, comprising:

provided a semiconductor material having a major surface;

forming a first layer of material over the major surface;

forming a second layer of material over the first layer of material;

forming a third layer of material over the second layer of material;

forming an opening that exposes a portion of the semiconductor material;

forming a trench in the semiconductor material, the trench extending from the major surface into the semiconductor material and sidewalls;

forming a cavity in the second material, the cavity extending laterally from the opening into the second material; and forming an electrically conductive material in the trench and the cavity.

10. The method of claim 9, wherein the first and third layers of material are oxide and the second layer of material is nitride.

11. The method of 9, wherein the electrically conductive material is polysilicon.

12. The method of 9, further including removing portions of the second and third materials.

13. The method of claim 9, wherein forming the cavity includes using a wet etchant to form the cavity.

14. The method of 9, further including forming dielectric material between the sidewalls of the trench and the electrically conductive material.

* * * * *